(12) United States Patent
Clarke et al.

(10) Patent No.: US 10,330,401 B2
(45) Date of Patent: Jun. 25, 2019

(54) MAGNETIC COUPLING FOR HEAT FLOW MANAGEMENT IN THERMOELECTRIC MODULES AND DEVICES THEREOF

(71) Applicant: LEDdynamics, Inc., Randolph, VT (US)

(72) Inventors: Shane Michael Clarke, Island Pond, VT (US); Daniel Miller Poitrast, Randolph, VT (US); Jason Michael Orzell, Randolph Center, VT (US); Anthony John Siano, Randolph Center, VT (US)

(73) Assignee: LEDdynamics, Inc., Randolph, VT (US)

(*) Notice: Subject to any disclaimer, the term of this patent is extended or adjusted under 35 U.S.C. 154(b) by 285 days.

(21) Appl. No.: 15/063,832

(22) Filed: Mar. 8, 2016

(65) Prior Publication Data

US 2016/0265855 A1 Sep. 15, 2016

Related U.S. Application Data

(60) Provisional application No. 62/129,986, filed on Mar. 9, 2015.

(51) Int. Cl.
*F28F 13/00* (2006.01)
*H01L 35/30* (2006.01)

(52) U.S. Cl.
CPC ............ *F28F 13/00* (2013.01); *H01L 35/30* (2013.01); *F28F 2013/005* (2013.01); *F28F 2013/008* (2013.01); *F28F 2275/22* (2013.01)

(58) Field of Classification Search
CPC .............................. F28F 13/00; H01L 35/30
USPC ........................................................ 136/205
See application file for complete search history.

(56) References Cited

U.S. PATENT DOCUMENTS

| | | | | |
|---|---|---|---|---|
| 3,057,939 A * | 10/1962 | Fritts | ...................... | H01L 35/00 136/208 |
| 3,130,285 A * | 4/1964 | Larsen | .................... | H01H 37/12 335/217 |
| 4,778,378 A * | 10/1988 | Dolnick | .................. | F23N 5/082 136/253 |
| 5,658,324 A * | 8/1997 | Bailey, Sr. | ................ | A61F 7/10 607/104 |
| 6,347,521 B1 * | 2/2002 | Kadotani | ................ | F25B 21/02 136/204 |
| 2005/0198777 A1 * | 9/2005 | Mabe | ........................ | E05D 5/10 16/308 |
| 2006/0266403 A1 * | 11/2006 | Hiller | ...................... | H01L 35/00 136/205 |
| 2011/0277815 A1 * | 11/2011 | Sankrithi | .................. | F24J 2/14 136/246 |

(Continued)

*Primary Examiner* — Jayne L Mershon
(74) *Attorney, Agent, or Firm* — Thomas G. Ference

(57) ABSTRACT

A device for coupling to a heat source, the device includes thermoelectric elements and a coupling magnet. The thermoelectric elements harvest heat to generate electric current. The coupling magnet provides a coupling force between the thermoelectric elements and the heat source. The coupling magnet regulates thermal flow between the thermoelectric elements and the heat source as a function of temperature of the coupling magnet. The device acts to protect the thermoelectric elements and other associated components from heat damage that might otherwise occur if the heat source generates too much heat.

30 Claims, 11 Drawing Sheets

(56) References Cited

U.S. PATENT DOCUMENTS

2012/0060882 A1* 3/2012 Makansi ............... B82Y 10/00
                                                  136/201
2012/0312345 A1* 12/2012 Ward .................... H01L 35/02
                                                  136/230
2013/0180563 A1* 7/2013 Makansi ................ H01L 35/32
                                                  136/206
2015/0333457 A1* 11/2015 Liu ..................... H01R 13/713
                                                  335/208

* cited by examiner

MAGNETIC COUPLING FOR HEAT FLOW MANAGEMENT IN THERMOELECTRIC MODULES AND DEVICES THEREOF

RELATED APPLICATIONS

This application claims the benefit of priority of U.S. Provisional Patent Application No. 62/129,986, filed Mar. 9, 2015, which is herein incorporated by reference.

FIELD

The present invention generally relates to regulating heat flow through a thermoelectric module. More specifically, it relates to devices that incorporate a magnetic coupling force to regulate the thermal conductivity at various interfaces between the heat source and the thermoelectric module.

BACKGROUND

Thermoelectric generators are becoming popular as backup sources of electricity to power electronic devices when traditional power sources are unavailable or wired grids go down. A thermoelectric generator includes a thermoelectric module with associated components for cooling the module, regulating power out, storing power and delivering power to various electronic devices. Thermoelectric generators work most efficiently when coupled to high thermal output devices such as wood and gas stoves, fireplaces, etc. These thermal output devices can under some circumstances exceed temperatures of 450° C. Therefore controlling the input temperature to a thermoelectric generator is necessary to prevent the thermoelectric modules, any electronics, power storage elements and cooling system components from over-heating. Most thermoelectric modules are designed to handle only 330° C. continuously and 400° C. intermittently. Having a system that can regulate heat flow on its own can prevent expensive thermoelectric generators and associated components from being damaged.

The present invention aims to provide devices that can self-regulate the input temperature to a thermoelectric module or thermoelectric generator and also control heat flow through the thermoelectric module. The invention also provides for a simple method of attachment of these devices to the heat source.

SUMMARY

In one implementation, the present disclosure is directed to a device for coupling to a heat source. The device is comprised of thermoelectric elements, a heat-receiving element and a heat-exiting element. The heat-receiving element has a heat-receiving interface for the thermoelectric elements. The heat-exiting element has a heat-exiting surface for the thermoelectric elements. The device further comprises a coupling magnet mounted to provide a coupling force that adjusts pressure for at least one from the group consisting of the heat-receiving interface and the heat-exiting interface. The coupling magnet regulates thermal flow through the thermoelectric elements as a function temperature of the coupling magnet.

In another implementation, the present disclosure is directed to a device for coupling to a heat source. The device is comprised of a thermoelectric module and a coupling magnet mounted with the thermoelectric module. The coupling magnet provides a magnetic coupling force between the thermoelectric module and the heat source. The coupling magnet regulates thermal conductivity between the thermoelectric module and the heat source as a function of temperature of the coupling magnet.

BRIEF DESCRIPTION OF DRAWINGS

For the purposes of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
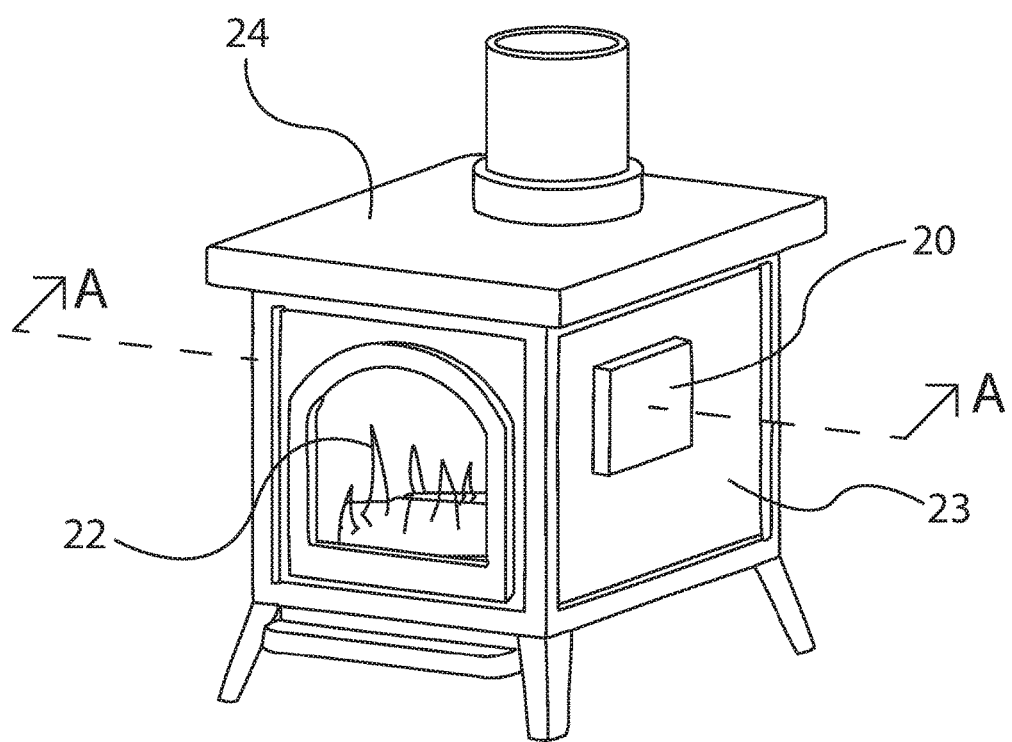
FIG. 1 is a perspective view of an exemplary environment in which a device according to the present invention is coupled to a heat source.
Figure 2:
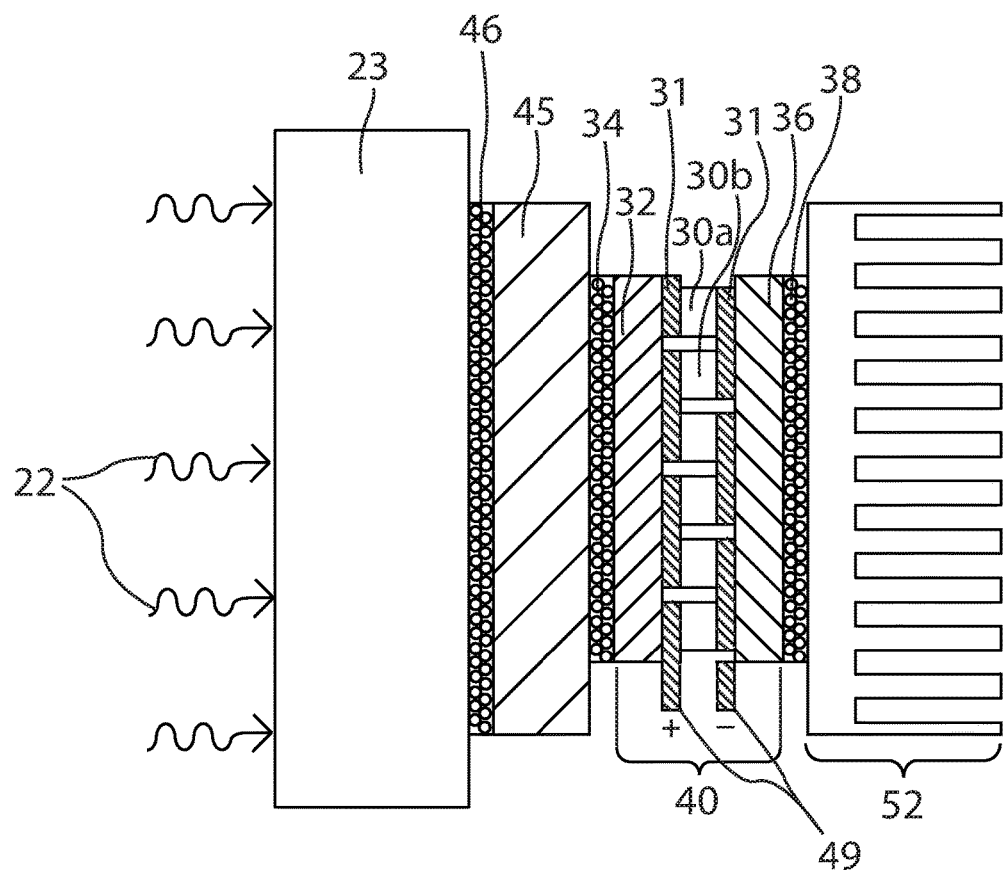
FIG. 2 is a side, sectional view through a generic thermoelectric device of the present invention, this device may be modified to include coupling magnets to provide a device as shown in FIG. 1.

FIGS. 1-11c show various aspects of device 20 for coupling to heat source 22. Heat source 22 may be contained within a wood stove 24 or other heat generating device, FIG. 1. Heat source 22 generally includes a heat element 23 (wall or surface) that device 20 may be coupled to. Heat source 22 has an output temperature. Device 20 comprises thermoelectric elements 30. Thermoelectric elements 30 are p-type 30a and n-type 30b semiconductor elements that are heavily doped with electrical carriers. Thermoelectric elements 30 are connected in series by connections 31. Operation of thermoelectric device 20 is based on the Seebeck effect. The Seebeck effect is the conversion of energy from temperature differences directly into electricity. Device 20 further comprises a heat-receiving element 32 having a heat-receiving interface 34 for thermoelectric elements 30. Device 20 further comprises a heat-exiting element 36 having a heat-exiting interface 38. Heat-receiving element 32 and heat-exiting element 36 may be a substrate such as a metal plate ceramic, etc. Together thermoelectric elements 30, heat-receiving element 32 and heat-exiting element 36 create thermoelectric module 40, FIG. 2. Thermoelectric module 40 harvests heat to generate electric current. Electric current generated can be used to power any type of electrical device or sensor. A coupling magnet 44 is mounted to provide a coupling force within thermoelectric module 40 and/or a coupling force from the thermoelectric module to heat source 22. An additional holding plate 45 may be included for additional coupling configurations. The coupling force may adjust pressure for at least one from the group consisting of heat-receiving interface 34, heat-exiting interface 38 and an interface between said heat-receiving element 32 and heat source 22 (holding interface 46). To modify the thermal conductivity of any or all thermal interfaces, a thermally conductive material may be placed at the interfaces, e.g. graphite, graphene, gold, silver, copper, aluminum, alumina, alumina nitride, silicon carbide, beryllium oxide and diamond. The coupling magnet 44 regulates thermal flow through thermoelectric elements 30 as a function of temperature of the coupling magnet by changing pressure at thermal interfaces or allowing for coupling and decoupling of the thermoelectric module from heat source 22.

The magnetic coupling force is the result of attraction between coupling magnet 44 and at least one from the group including ferromagnetic heat element 23 (e.g., stove wall), ferromagnetic holding plate 45 and/or holding magnet 64 mounted with the holding plate, ferromagnetic heat-receiving element 32, ferromagnetic heat-exiting element 36 or any other magnetic configurations where the coupling magnet is increasing the pressure (clamping force) at interfaces to control thermal conductivity. The magnetic coupling force in general changes with temperature and thereby changes thermal conductivity with temperature. Device 20 may also include an additional opposing force element 43 that generates an opposing force that acts to counter the coupling force. When the opposing force is present, the opposing force in conjunction with the magnetic coupling force adjusts the thermal conductivity at various interfaces within thermoelectric module 40 and between the thermoelectric module 40 and heat source 22 to regulate the temperature of the thermoelectric module. The opposing force may be the weight of the thermal device. Alternatively, a bias element 68 such as a bimetallic element or spring may create the opposing force. The bimetallic element may create an opposing force that changes with temperature. The bias element 68 may also be an electromagnet powered from current generated by the thermoelectric module 40.

Thermal conductivity is the property of a material to conduct heat. For the purposes of this disclosure, thermal flow is a function of the temperature difference between heat source 22 and thermoelectric elements 30 (or any components associated with the thermoelectric module) and the thermal conductivity there between. One way to change thermal flow through thermoelectric elements 30 is to change the thermal conductivity of interfaces outside thermoelectric module 40 or within the module. For example, thermoelectric module 40 as a whole can either couple or decouple from the heat source creating a thermal gap 70 between heat source 22 and thermoelectric module. Within module 40, thermal conductivity changes may occur by changing the number of thermally conductive contact points at the interfaces within the module. To further modify the thermal conductivity of any or all thermal interfaces, a thermally conductive material may be placed at the interfaces, e.g. graphite, graphene, gold, silver, copper, aluminum, alumina, alumina nitride, silicon carbide, beryllium oxide and diamond. These materials may be placed as a powder, mesh, composite or other type of layer. The thermal conductivity of the conductive material changes as a function of the coupling force between the heat source and thermoelectric module as more force creates less thermal gaps and better thermal conduction through the conductive layer. The magnitude of the coupling force generated by coupling magnet 44 is what changes thermal conductivity through one of the above stated modes. The coupling force is primarily regulated by temperature changes within coupling magnet 44 that change the magnetic coupling force. The following examples illustrate various devices 20 for regulating thermal flow through a thermoelectric module 40.

Figure 3:
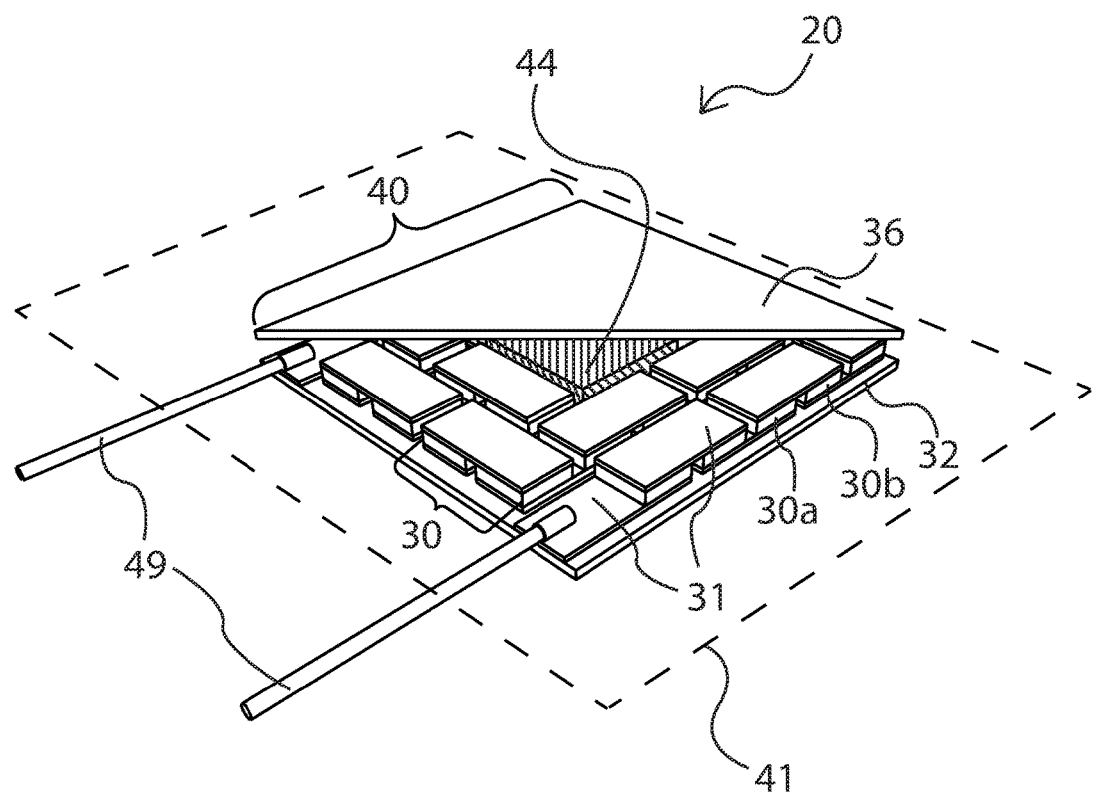
FIG. 3 is a partial cut away perspective view of an embodiment of the device shown in FIG. 1 where the coupling magnet is surrounded by the array of thermoelectric elements.

FIG. 3 shows a device 20 that is a thermoelectric module 40 with a coupling magnet 44 embedded within the array of thermoelectric elements 30. Thermoelectric elements 30 may reside within a plane 41. Placement of coupling magnet 44 may vary depending on the application, but generally lie within plane 41 and between individual thermoelectric elements 30 within the array of thermoelectric elements. Thermoelectric elements 30 are connected in series by connections 31 and mounted between heat-receiving element 32 and heat-exiting element 36. Electrical leads 49 carry electrical current to any electric elements 55. One structure by which thermal conductivity is controlled for device 20 is to have coupling magnet 44 hold the device to a ferromagnetic wall or magnetic holding plate. Device 20 may be held on the bottom or side of the heat source allowing gravity to provide an opposing force to the magnetic coupling force. If the holding temperature of coupling magnet 44 is exceeded, the thermoelectric module 40 will decouple from heat source 22, slide down the wall to a cooler section of the wall or drop off the wall, and prevent overheating of the thermoelectric module and any other components mounted with the thermoelectric module. Another structure by which thermal conductivity is controlled for device 20 is to have coupling magnet 44 hold heat-receiving element 32 and heat-exiting element 36 together. The tighter heat-receiving element 32 and heat-exiting element 36 are held together, the higher the thermal conductivity and better the heat flow. If the temperature of the coupling magnet 44 is increased, the coupling magnet provides a lower coupling force and the thermal conductivity of the coupled interfaces decreases allowing less heat flow through the device. In this manner one can optimize heat flow through thermoelectric module 40 for optimal performance.

Figure 4A:
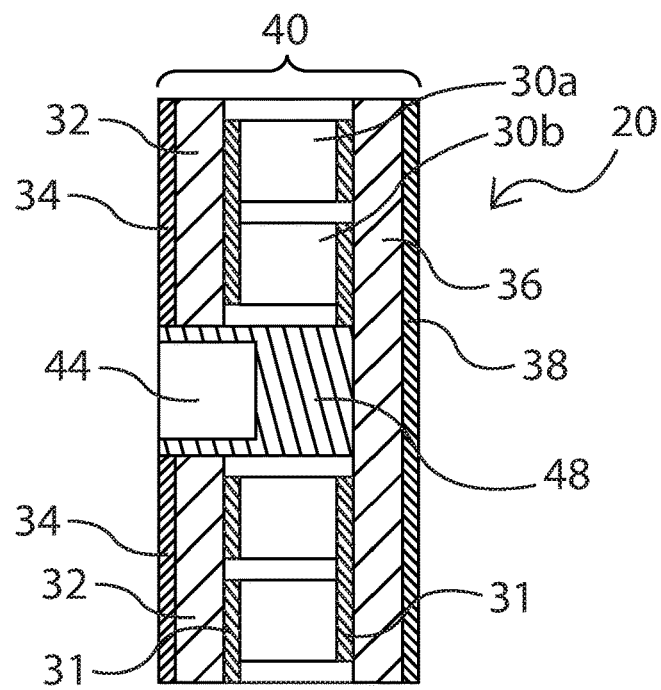
FIG. 4a is a side, sectional view along line A-A of the device shown in FIG. 1, this view shows one embodiment for incorporating coupling magnets into the device.
Figure 4B:
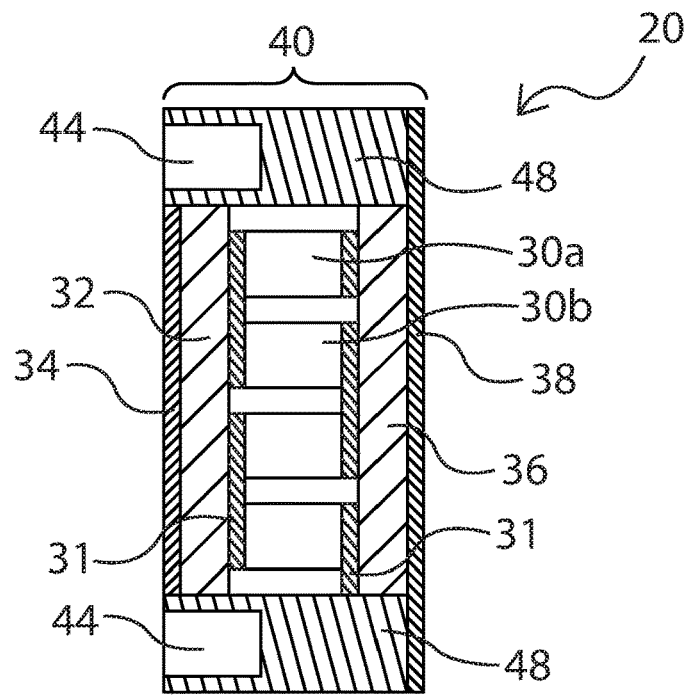
FIG. 4b is a side, sectional view along line A-A of the device shown in FIG. 1, this view shows another embodiment for incorporating coupling magnets into the device.

FIGS. 4a and 4b show devices 20 where coupling magnets 44 are each thermally isolated from heat-receiving element 32 and heat-exiting element 36 by a thermal insulator 48. Thermal insulator 48 thereby drives thermal flow through thermoelectric elements 30. Electrical leads 49 carry electrical current out of thermoelectric module 40.

Figure 5A:
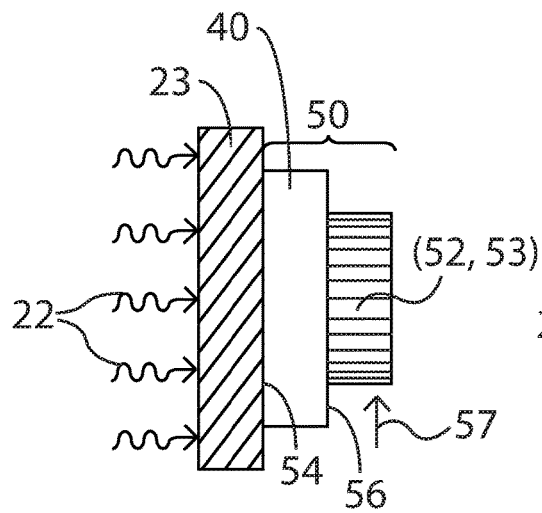
FIG. 5a is schematic diagram of a gas cooling system that may be used as the cooling element in conjunction with any of the devices shown in FIGS. 1-4b and 7a-10b.
Figure 5B:
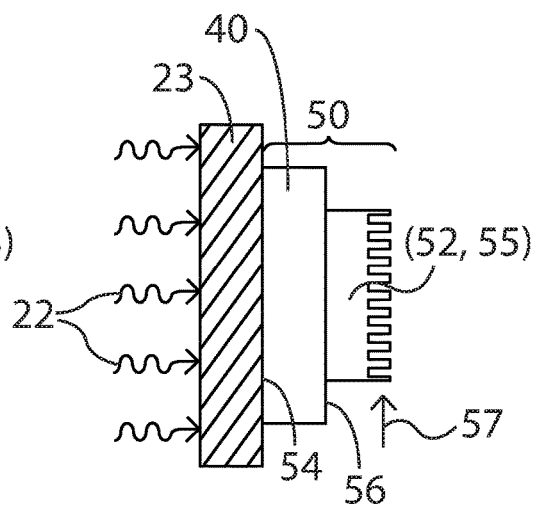
FIG. 5b is schematic diagram of a gas cooling system that may be used as the cooling element in conjunction with any of the devices shown in FIGS. 1-4b and 7a-10b.
Figure 5C:
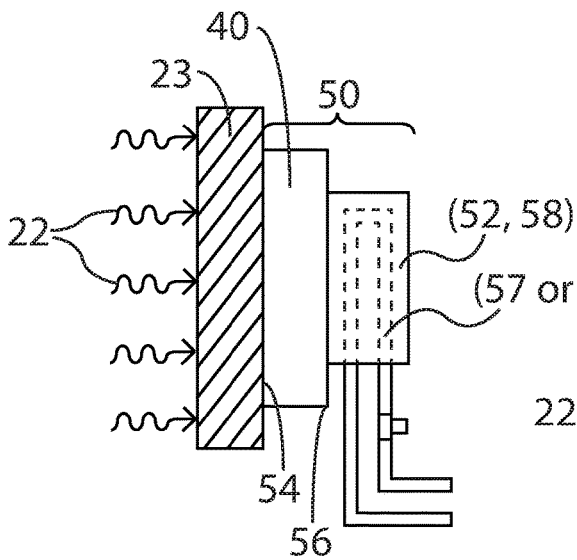
FIG. 5c is schematic diagram of a fluid cooling system that may be used as the cooling element in conjunction with any of the devices shown in FIGS. 1-4b and 7a-10b.
Figure 5D:
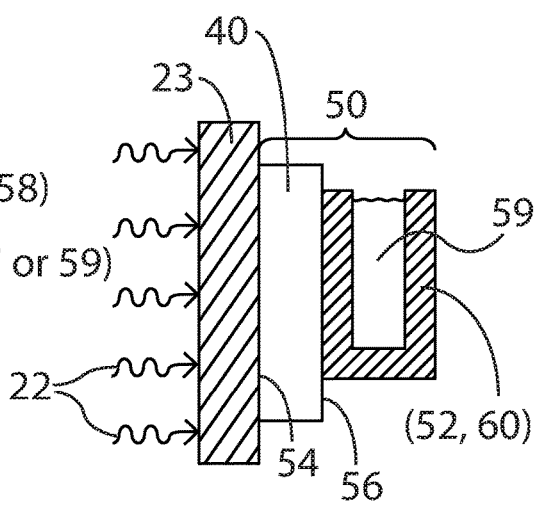
FIG. 5d is schematic diagram of a liquid cooling system that may be used as the cooling element in conjunction with any of the devices shown in FIGS. 1-4b and 7a-10b.

For a thermoelectric module 40 to become a thermoelectric generator (TEG) 50 and continuously generate electricity, some sort of cooling element 52 (a single element or combinations of elements creating a system) is required to keep a temperature difference between heat-receiving side 54 and heat-exiting side 56 of thermoelectric module 40. Cooling element 52 may be heat-exiting element 36. Cooling elements 52 may be active or passive and may utilize fluids such as gases 57 (air, helium, etc.) or liquids 59 (water, etc.), FIGS. 5a-5d. Cooling element 52 may incorporate a fan 53 in FIG. 5a or a heat sink 55 with cooling fins in FIG. 5b. Cooling element 52 may be a fluid pumping system 58 that pumps a fluid (gas 57 or liquid 59) such as shown in FIG. 5c or evaporative system 60 with a vessel holding liquid 59 that evaporates as shown in FIG. 5d.

A variety of electric elements 55 may be integrated with device 20 to control electrical output. Still other electric elements may add further function to device 20. For example, device 20 may have sensors such as: temperature, magnetic fields, gravity, humidity, moisture, vibration, pressure, electrical fields, sound and chemical sensors. Device 20 may have wireless devices such as: transceivers, receivers and transmitters including BLUETOOTH®, ZIGBEE®, Wi-Fi, etc. Device 20 may have power regulation devices such as: USB ports and a battery charger. Device 20 may also include external devices such as: LED lights, fans and radios. Device 20 may be incorporated as part of the Internet of Things (IOT).

Device 20 may be attached to the top, bottom or side (FIG. 1) of heat source 22 depending on how the device is configured for attachment and the desired location from which the user would like to harvest heat to create electricity. Coupling magnet 44 provides a magnetic coupling force between thermoelectric module 40 and heat source 22. Coupling magnet 44 regulates thermal conductivity across various interfaces within thermoelectric module 40 and between the thermoelectric module and heat source 22 as a function of temperature of coupling magnet 44. By controlling the thermal conductivity, it is possible to control how much heat is transmitted from heat source 22 through thermoelectric module 40 and other components and thereby protected all of these components from overheating if the heat source generates so much heat that the heat source could ultimately damage the components.

Figure 6:
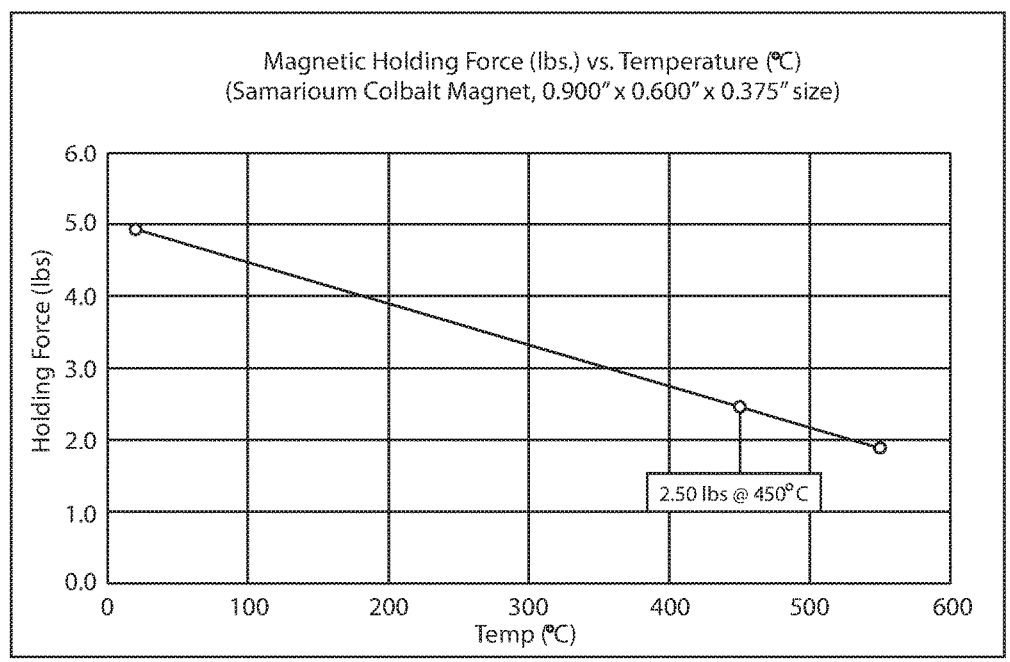
FIG. 6 is a graph of holding force versus temperature provided by a samarium cobalt magnet associated with one embodiment of the device depicted in FIG. 1.

One example of a coupling magnet 44 for use with device 20 is a samarium cobalt magnet. Alternatively a neodymium magnet or other high temperature magnets could be used. FIG. 6 diagrams holding force versus temperature for the samarium cobalt magnet. A samarium cobalt magnet approximately 0.900"×0.600"×0.375" in size was used to for the data in FIG. 6. The magnet had a holding force of 5.0-lbs. at 20° C., which diminished to 2.5-lbs. at 450° C. If the thermoelectric generator unit weighs 28-lbs and uses ten magnets, it will hold onto the side of a stove at 20° C., but begin to slide and/or fall off as the temperature surpasses 400° C., and as a result the thermal electric generator will not be able to overheat at 450° C. Ultimately device 20 can be designed to decouple at any desired temperature by varying the type, quantity and orientation of coupling magnets 44 used. Coupling magnet 44 could also be an electromagnet powered by electric current generated by thermoelectric module 40.

Figure 7A:
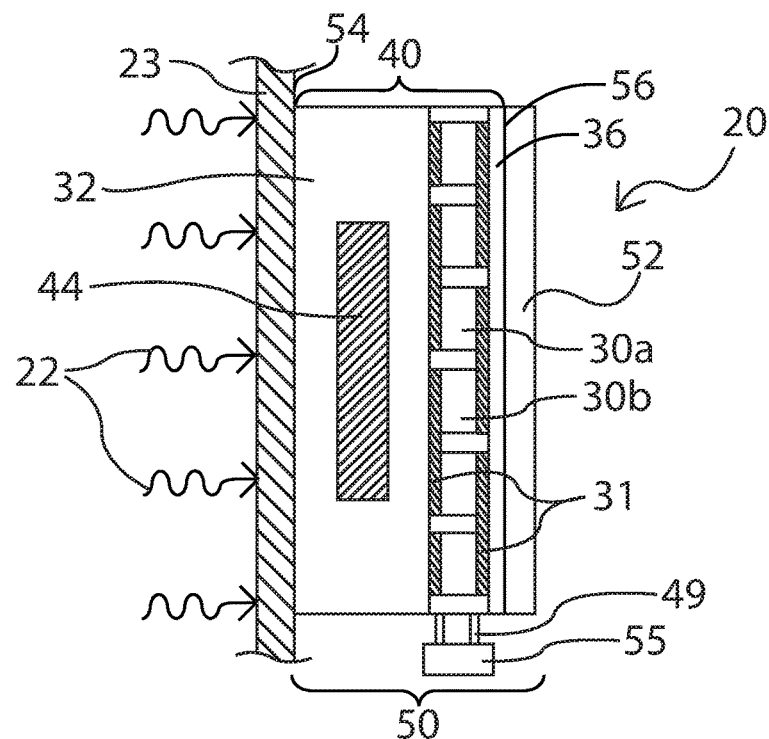
FIG. 7a is a side, sectional view along line A-A of the device shown FIG. 1, this view shows a generic device with schematic representations of elements associated with the device.
Figure 7B:
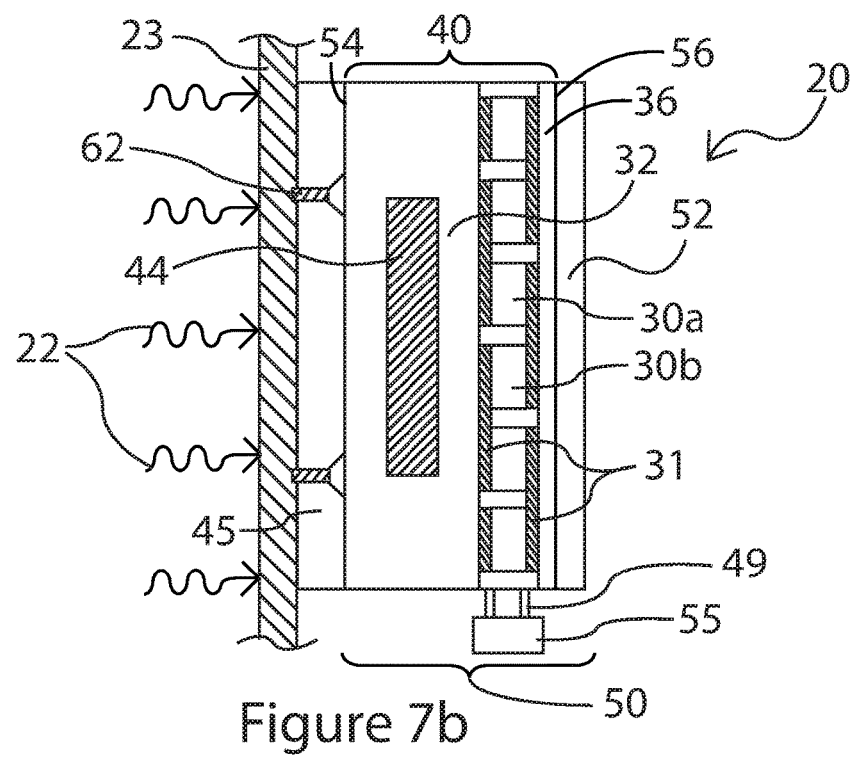
FIG. 7b is a side, sectional view along line A-A of the device shown FIG. 1, this view shows a generic device with schematic representations of elements associated with the device.

FIGS. 7a and 7b illustrate generic devices 20 that include a thermoelectric generator 50, coupling magnet 44 and other associated components. Heat source 22 has a heat element 23 to which the device can attach. For a wood stove 24, heat element 23 might be a ferromagnetic wall such as an iron wall, FIG. 7a. However in other embodiments, FIG. 7b, wall heat element 23 might be a non-magnetic wall and have an additional holding plate 45 that can be fastened to the wall by fasteners 62. Holding plate 45 would preferably either be made of a magnetic material or have a holding magnet 64 mounted with the holding plate. Coupling magnet 44 may be contained within heat-receiving element 32 and/or thermoelectric elements 30. When present, cooling element 52 acts to cool the heat-exiting side 56 of thermoelectric module 40. Electric elements 55 may be mounted with thermoelectric module 40 and/or be located elsewhere within or external to device 20 to process, control and deliver electric current generated by the thermoelectric module.

Figure 8A:
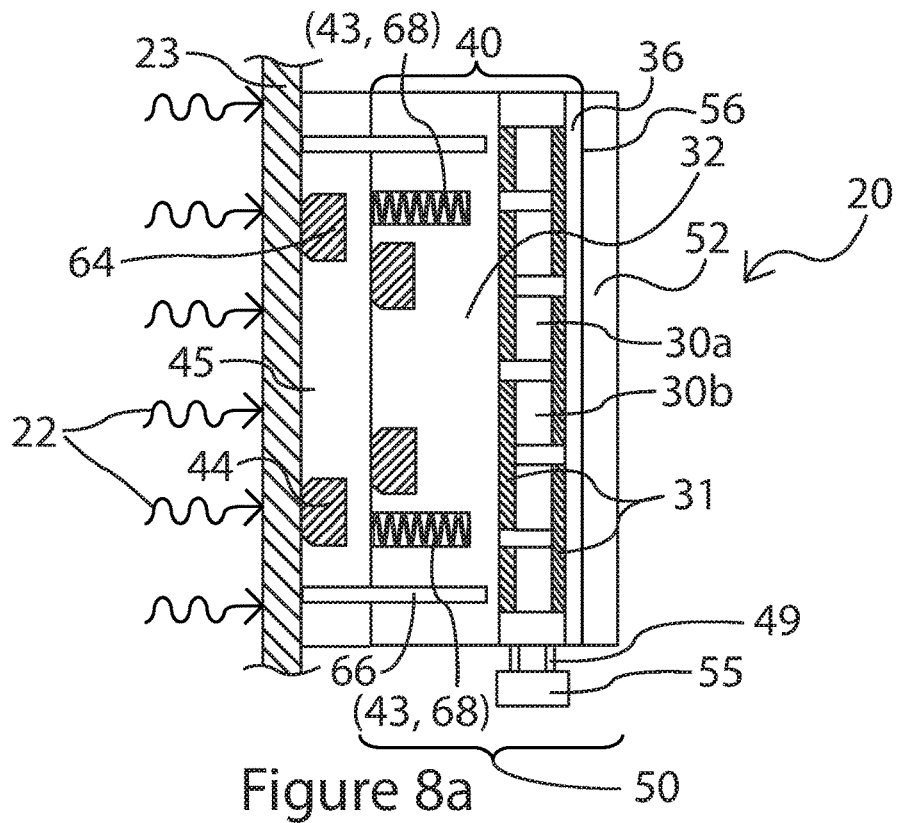
FIG. 8a is a side, sectional view of an embodiment of the device shown in FIG. 7b, the device shown in a low temperature state and using a biasing force in conjunction with coupling magnets.
Figure 8B:
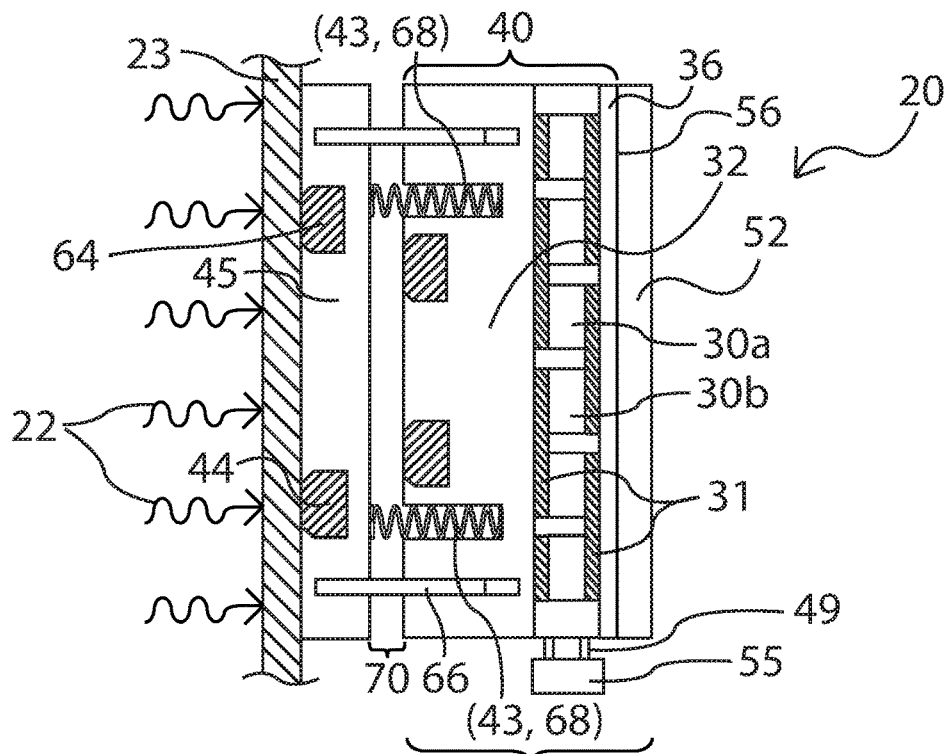
FIG. 8b is the embodiment shown in FIG. 8a depicting the device in a higher temperature state.

FIGS. 8a and 8b show another embodiment of device 20, in this embodiment the device includes a thermoelectric generator 50. Device 20 also includes a holding plate 45 that mounts to heat element 23 of a heat source 22. In the drawn embodiment, heat element 23 is a ferromagnetic wall and holding plate 45 has holding magnets 64 to hold the plate to the wall. This embodiment could also have a holding plate 45 where the holding plate is fastened to heat element 23 with fasteners 62, the holding plate itself being made from a ferromagnetic material or having holding magnets 64 embedded within the holding plate. Thermoelectric generator 50 includes thermoelectric module 40 having a heat-receiving side 54 and a heat-exiting side 56. Cooling element 52 is integrated as heat-exiting element 36 or mounted to heat-exiting side 56. Coupling magnets 44 mounted with thermoelectric module 40 are mounted within or coupled to heat-receiving element 32. Heat-receiving element 32 is coupled to holding plate 45 and moves along guides 66. Bias element 68 creates an opposing force to the coupling force generated between coupling magnets 44 and holding magnets 64. Bias element 68 may be a spring or other opposing force generator. Electrical leads 49 carry electrical current to any electric elements 55. Thermal resistance is controlled for device 20 by having coupling magnet 44 hold heat-receiving element 32 in contact with holding plate 45. If the holding temperature of coupling magnet 44 is exceeded, the thermoelectric generator 50 will separate from holding plate 45 preventing overheating of the thermoelectric module and any other components mounted with the thermoelectric module, FIG. 8b. The magnitude of gap 70 may also vary as a function of temperature and thereby adjust thermal resistance between holding plate 45 and thermoelectric generator 50 in a continuous manner. Furthermore, a thermally conductive material may be placed between holding plate 45 and thermoelectric generator 50. The thermally conductive material may compress and expand with the coupling force and thereby change the thermal resistance associated with the gap. Thermoelectric generator 50 may separate and reconnect from heat source 22 automatically based on the temperature of the heat source.

Figure 9A:
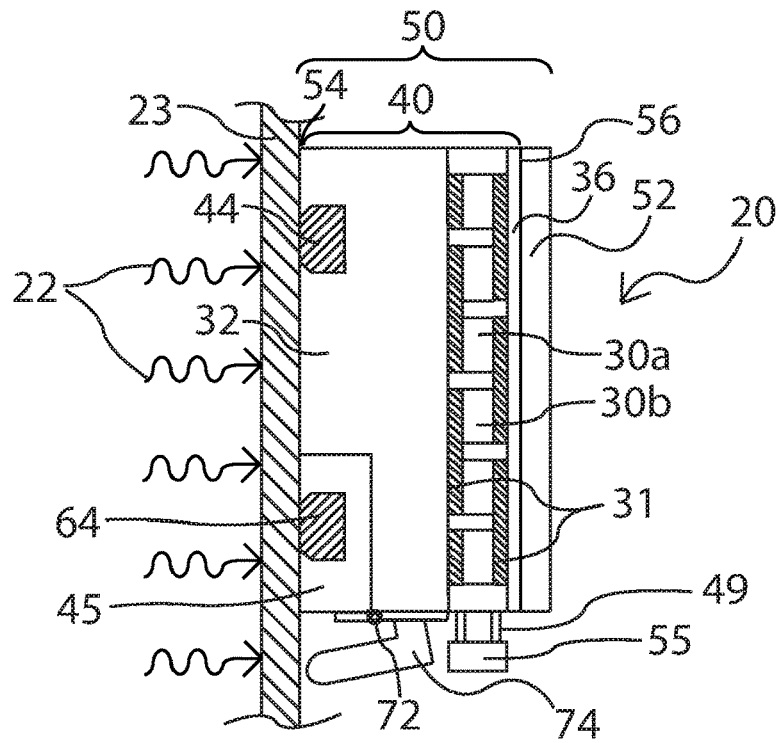
FIG. 9a is a side, sectional view of an embodiment of the device shown in FIG. 7b, the device shown in a low temperature state and using a kickstand in conjunction with coupling magnets.
Figure 9B:
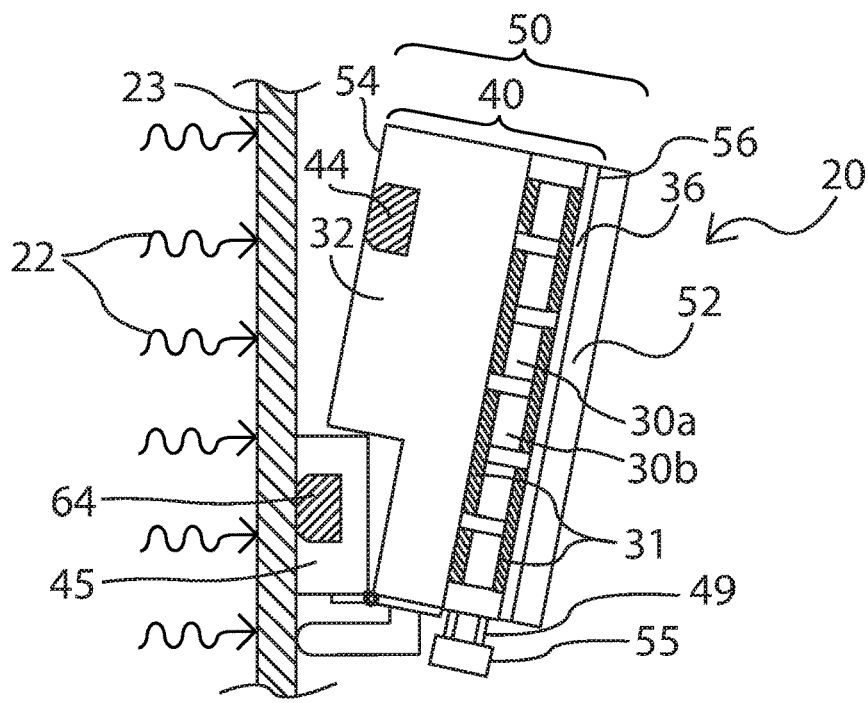
FIG. 9b is the embodiment shown in FIG. 9a depicting the device in a higher temperature state.

FIGS. 9a and 9b show another embodiment of device 20, in this embodiment the device includes a thermoelectric generator 50. Device 20 also includes a holding plate 45 that mounts to heat element 23 of a heat source 22. In the drawn embodiment, heat element 23 is a ferromagnetic wall and holding plate 45 has holding magnets 64 to hold the holding plate to the wall. This embodiment could also have a holding plate 45 where the holding plate is fastened to heat element 23 with fasteners 62, the holding plate itself being made from a ferromagnetic material or having holding magnets 64 embedded within the holding plate. Thermoelectric generator 50 includes thermoelectric module 40 having a heat-receiving side 54 and a heat-exiting side 56. Cooling element 52 is integrated as heat-exiting element 36 or mounted to heat-exiting side 56. Coupling magnets 44 mounted with thermoelectric module 40 are mounted within or coupled to heat-receiving element 32. Heat-receiving element 32 is coupled by a hinge 72 and kickstand 74 to holding plate 45. Electrical leads 49 carry electrical current to any electric elements 55. Thermal resistance is controlled for device 20 by having coupling magnet 44 hold heat-receiving element 32 in contact with ferromagnetic heat element 23. If the holding temperature of coupling magnet 44 is exceeded, the thermoelectric generator 50 will separate from heat element 23 and drop away from the wall preventing overheating of the thermoelectric module and any other components mounted with the thermoelectric module, FIG. 9b. Holding magnet 64 has a stronger holding force with temperature than coupling magnet 44. Kickstand 74 limits the distance thermoelectric generator 50 can move away from heat element 23.

Figure 10A:
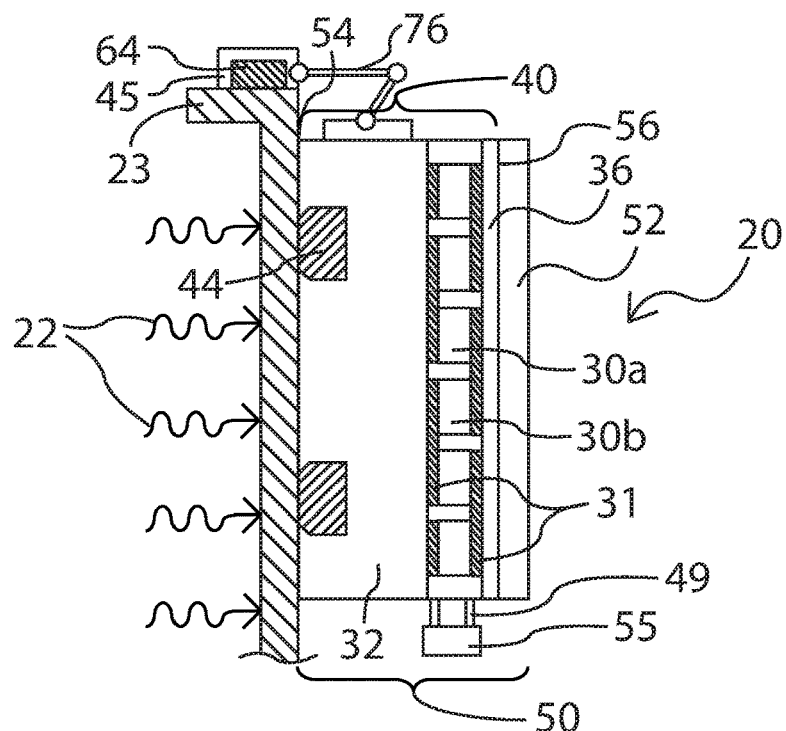
FIG. 10a is a side, sectional view of an embodiment of the device shown in FIG. 7b, the device shown in a low temperature state and using a tether in conjunction with coupling magnets.
Figure 10B:
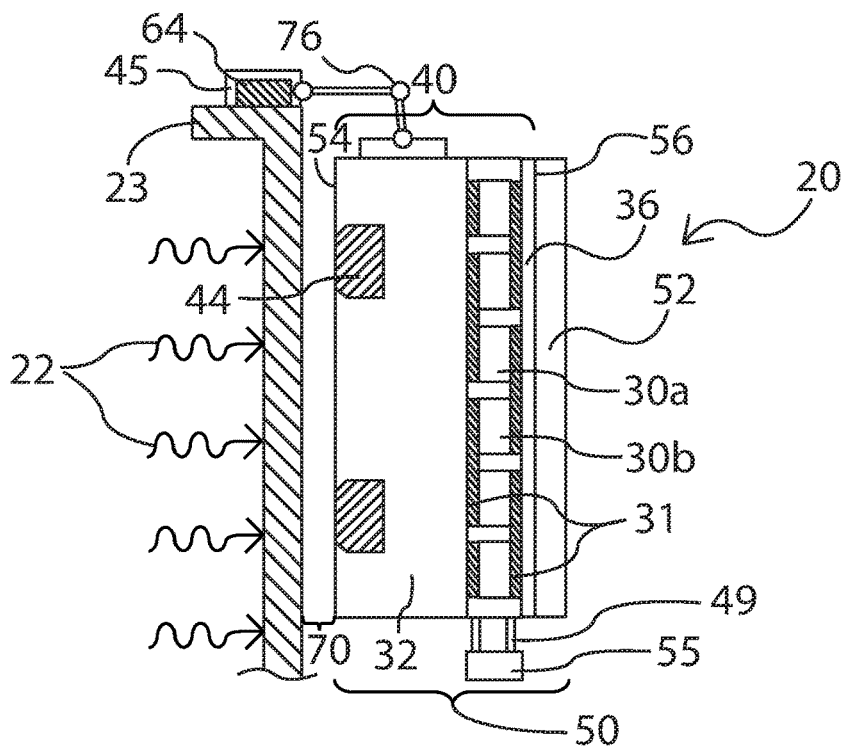
FIG. 10b is the embodiment shown in FIG. 10a depicting the device in a higher temperature state.

FIGS. 10a and 10b show another embodiment of device 20, in this embodiment the device includes a thermoelectric generator 50. Device 20 also includes a holding plate 45 that mounts to heat element 23 of a heat source 22. In the drawn embodiment, heat element 23 is a ferromagnetic wall and holding plate 45 has holding magnets 64 to hold the plate to the wall. This embodiment could also have a holding plate 45 where the holding plate is fastened to heat element 23 with fasteners 62, the holding plate itself being made from a ferromagnetic material or having holding magnets 64 embedded within the holding plate. Thermoelectric generator 50 includes thermoelectric module 40 having a heat-receiving side 54 and a heat-exiting side 56. Cooling element 52 is integrated as heat-exiting element or mounted to heat-exiting side 56. Coupling magnets 44 mounted with thermoelectric module 40 are mounted within heat-receiving element 32. Thermoelectric generator 50 is coupled by a tether 76 to holding plate 45. Electrical leads 49 carry electrical current to any electric elements 55. Thermal conductivity is controlled for device 20 by having coupling magnet 44 hold heat-receiving element 32 in contact with ferromagnetic heat element. If the holding temperature of coupling magnet 44 is exceeded, the thermoelectric generator 50 will separate from heat element 23 and drop away from the wall preventing overheating of the thermoelectric module and any other components mounted with the thermoelectric module, FIG. 10b. Holding magnet 64 has a stronger holding force with temperature than coupling magnet 44. Tether 76 limits the gap 70 distance thermoelectric generator 50 can move away from heat element 23 and stops the thermoelectric generator from detaching in a detrimental manner.

Figure 11A:
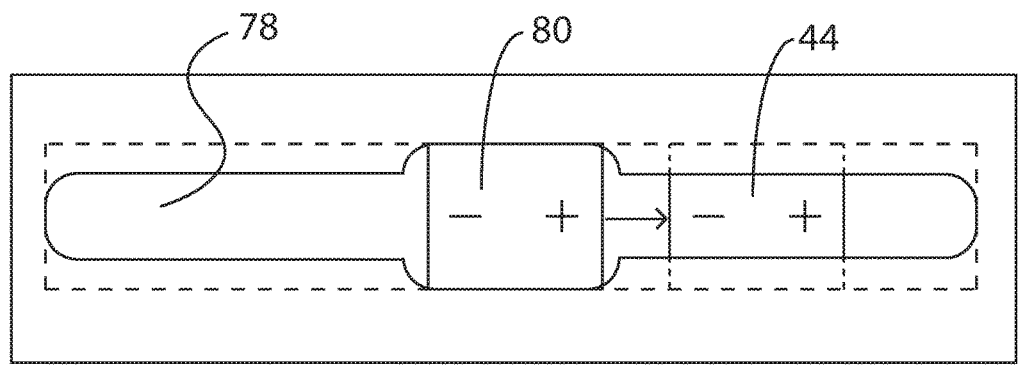
FIG. 11a is a plan view of a heat-receiving element and/or holding plate illustrating a first step in assembling coupling magnets for one embodiment of the device shown in FIG. 7a-10b.
Figure 11B:
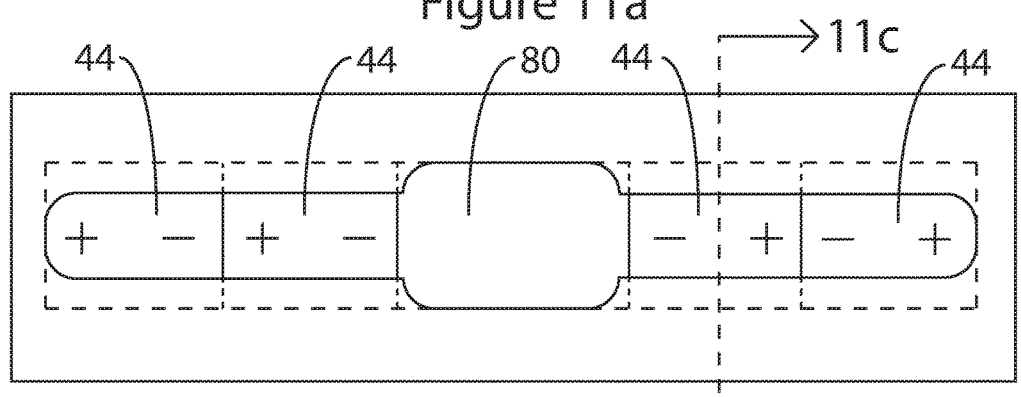
FIG. 11b is a plan view as shown in FIG. 11a, but now with coupling magnets fully assembled.
Figure 11C:
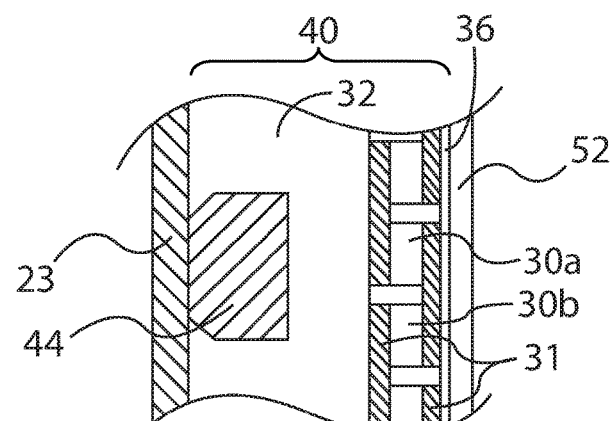
FIG. 11c is side, sectional view along line 11c-11c of FIG. 11b.

FIGS. 11a-11c illustrate one embodiment for mounting coupling magnets 44 or holding magnets 64. FIG. 11a shows how a slot 78 is created within a plate. Magnets (44 or 64) are then slipped through opening 80 and pushed to either end of slot 78. By having magnets (44 or 64) arranged in an opposite pole configuration on each end, the magnets have a magnetic force that pushes against each other so that the magnets will not slide back out opening 80.

While several embodiments of the invention, together with modifications thereof, have been described in detail herein and illustrated in the accompanying drawings, it will be evident that various further modifications are possible without departing from the scope of the invention. The scope of the claims should not be limited by the preferred embodiments set forth in the examples, but should be given the broadest interpretation consistent with the description as a whole.

What is claimed is:

1. A device for coupling to a heat source, comprising:
a) a thermoelectric module;
b) a coupling magnet mounted with said thermoelectric module, said coupling magnet providing a magnetic coupling force between said thermoelectric module and the heat source;
c) a bias element adapted to operate between the heat source and said coupling magnet, wherein said bias element creates an opposing force against said magnetic coupling force that reduces the coupling force between said thermoelectric module and the heat source;
d) wherein said coupling magnet is coupled to move towards and away from the heat source in response to changes in said magnetic coupling force; wherein this motion self-regulates to limit input temperature to said thermoelectric module from the heat source as a function of temperature of said coupling magnet.

2. A device as recited in claim 1, wherein said thermoelectric module harvests heat to generate electric current.

3. A device as recited in claim 1, wherein said thermoelectric module does at least one from the group consisting of couple and decouple from the heat source to control temperature of said thermoelectric module.

4. A device as recited in claim 3, wherein said coupling and decoupling is in response to temperature changes within said coupling magnet.

5. A device as recited in claim 1, wherein said device slides to a cooler location on the heat source when a set output temperature for the heat source is exceeded.

6. A device as recited in claim 1, wherein said thermoelectric module is an array of individual thermoelectric elements.

7. A device as recited in claim 6, wherein said array of thermoelectric elements is an array of p-type and n-type semiconductor elements that are heavily doped with electrical carriers.

8. A device as recited in claim 6, wherein said coupling magnet is embedded within said array between said individual thermoelectric elements.

9. A device as recited in claim 1, wherein said coupling magnet has a magnetic force that changes with temperature.

10. A device as recited in claim 9, wherein said coupling magnet is a samarium cobalt magnet.

11. A device as recited in claim 1, wherein said coupling magnet is an electromagnet powered from current generated by said thermoelectric module.

12. A device as recited in claim 1, wherein said bias element is a bimetallic element, wherein said bimetallic element creates an opposing force that changes with temperature.

13. A device as recited in claim 1, wherein said bias element is a spring.

14. A device as recited in claim 1, wherein said bias element is an electromagnet powered from current generated by said thermoelectric module.

15. A device as recited in claim 1, further including a holding plate with a holding magnet mounted with said holding plate.

16. A device as recited in claim 1, further including a holding plate for mounting to the heat source and a tether between said holding plate and said thermoelectric module; wherein said tether limits the distance the thermoelectric module can move from the heat source in response to changes in said magnetic coupling force.

17. A device as recited in claim 1, wherein said thermoelectric module has a heat-exiting side, further comprising a cooling element coupled to said heat-exiting side.

18. A device as recited in claim 17, wherein said cooling element is a liquid cooling system.

19. A device as recited in claim 17, wherein said cooling element is a gas cooling system.

20. A device as recited in claim 17, wherein said cooling element is at least one from the group consisting of an active cooling system and a passive cooling system.

21. A device as recited in claim 1, further including a holding plate for mounting to the heat source; wherein said coupling magnet is coupled to move towards and away from said holding plate against said opposing force in response to change in said magnetic coupling force.

22. A device for coupling to a heat source, comprising:
    a) a thermoelectric module;
    b) a coupling magnet mounted with said thermoelectric module, said coupling magnet providing a magnetic coupling force between said thermoelectric module and the heat source;
    c) guides configured to move said coupling magnet towards and way from said heat source along said guides in response to changes in said magnetic coupling force; and
    d) wherein this motion self-regulates to limit input temperature to said thermoelectric module from the heat source as a function of temperature of said coupling magnet.

23. A device as recited in claim 22, further including a holding plate for mounting to the heat source; wherein said coupling magnet is coupled to move towards and away from the heat source along said guides in response to change in said magnetic coupling force.

24. A device for coupling to a heat source, comprising:
    a) a thermoelectric module;
    b) a coupling magnet mounted with said thermoelectric module, said coupling magnet providing a magnetic coupling force between said thermoelectric module and the heat source;
    c) a hinge connecting the heat source and said coupling magnet;
    d) wherein said coupling magnet is coupled to rotate towards and away from said heat source in response to changes in said magnetic coupling force; wherein said this motion self-regulates to limit input temperature to said thermoelectric module from the heat source as a function of temperature of said coupling magnet.

25. A device as recited in claim 24, further including a kickstand between the heat source and said thermoelectric module to limit rotation of said thermoelectric module.

26. A device as recited in claim 24, further including a holding plate for mounting to the heat source; wherein said coupling magnet is coupled to rotate towards and away from said holding plate in response to changes in said magnetic coupling force.

27. A device for coupling to a heat source, comprising:
    a) a thermoelectric module;
    b) a coupling magnet mounted with said thermoelectric module, said coupling magnet providing a magnetic coupling force between said thermoelectric module and the heat source;
    c) a holding magnet integrated with the heat source, said holding magnet attracts said coupling magnet, wherein said holding magnet has a stronger force than said magnetic coupling force of said coupling magnet under the same temperature;
    d) wherein said coupling magnet is coupled to move towards and away from said heat source in response to changes in said magnetic coupling force; wherein said this motion self-regulates to limit input temperature to said thermoelectric module from the heat source as a function of temperature of said coupling magnet and holding magnet.

28. A device as recited in claim 27, further comprising an opposing force element creating an opposing force to said magnetic coupling force.

29. A device as recited in claim 28, wherein said opposing force element is the weight of said thermal device.

30. A device as recited in claim 27, further including a holding plate holding the holding magnet and for mounting to the heat source; wherein said coupling magnet is coupled to move towards and away from said holding plate in response to changes in said magnetic coupling force.

* * * * *